(12) United States Patent
Yanagida et al.

(10) Patent No.: US 6,933,564 B2
(45) Date of Patent: Aug. 23, 2005

(54) SEMICONDUCTOR INTEGRATED CIRCUIT DEVICE AND METHOD OF MANUFACTURING THE SAME

(75) Inventors: Youhei Yanagida, Hamura (JP); Katsuhiko Ichinose, Ome (JP); Tomohiro Saito, Tachikawa (JP); Shinichiro Mitani, Tokorozawa (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/352,022

(22) Filed: Jan. 28, 2003

(65) Prior Publication Data

US 2003/0132465 A1 Jul. 17, 2003

Related U.S. Application Data

(62) Division of application No. 10/147,045, filed on May 17, 2002, now Pat. No. 6,706,582.

(30) Foreign Application Priority Data

Aug. 13, 2001 (JP) ........................................ 2001-245331

(51) Int. Cl.$^7$ .............................................. H01L 29/76
(52) U.S. Cl. ...................................... 257/345; 257/403
(58) Field of Search ................................ 257/288, 345, 257/402–403

(56) References Cited

U.S. PATENT DOCUMENTS

| 4,701,349 A | 10/1987 | Koyanagi et al. ............ 427/228 |
| 5,578,509 A | * 11/1996 | Fujita .......................... 438/286 |
| 6,541,829 B2 | 4/2003 | Nishinohara et al. ........ 257/402 |
| 6,552,398 B2 | 4/2003 | Hsu et al. ................... 257/350 |
| 6,586,294 B1 | 7/2003 | Post et al. ................... 438/217 |

FOREIGN PATENT DOCUMENTS

| JP | 62-133712 | 6/1987 |
| JP | 2000-196079 | 7/2000 |

* cited by examiner

Primary Examiner—David S. Blum
(74) Attorney, Agent, or Firm—Miles & Stockbridge P.C.

(57) ABSTRACT

An impurity ion of a polarity opposite to that of an impurity ion forming an n-type diffusion layer is implanted into a lower portion of the n-type diffusion region in a region, in which n-channel type MISFET is to be formed, vertically with respect to a main surface of a semiconductor to form a first p-type pocket layer. Subsequently, an impurity of a p conduction type is implanted into a region between the n-type diffusion region and the first p-type pocket layer obliquely relative to the main surface of the semiconductor substrate to form a second p-type pocket layer. In this arrangement, the concentration of the impurity ion forming the second p-type pocket layer is made higher than the concentration of the impurity ion used to form the first p-type pocket layer.

30 Claims, 6 Drawing Sheets

SEMICONDUCTOR INTEGRATED CIRCUIT DEVICE AND METHOD OF MANUFACTURING THE SAME

CROSS-REFERENCE TO RELATED APPLICATIONS

This application is a divisional of Application Ser. No. 10/147,045 filed May 17, 2002, now U.S. Pat. No. 6,706,582.

BACKGROUND OF THE INVENTION

This invention relates to a semiconductor integrated circuit device and a method of manufacturing the same. More particularly, the invention relates to the manufacture of MISFET (metal insulator semiconductor field effect transistor) having a so-called punch through stopper structure and also to a technique effective for application to the MISFET.

For the purpose of improving the drive ability of MISFET, the reduction in gate length of MISFET is now in progress. A shorter gate length of MISFET results in a shorter channel length, rendering the distance between a source and a drain shorter. This affords great influences of the source and drain characteristics on the electric field and potential distribution. One of the influences includes a short channel effect wherein when a channel length is at a certain level or below, the threshold voltage of MISFET abruptly lowers.

One of the phenomena caused by the short channel effect includes a lowering of the breakdown voltage between the source and drain of the MISFET. This is ascribed to a so-called punch through wherein a shorter gate length leads to the connection between a source depletion layer and a drain depletion layer, under which an electric current passes across the source and drain although any channel between the source and drain is not formed.

The punch through is divided into two categories including a shallow punch through that occurs in the vicinity of the surface of a semiconductor substrate and a deep punch through that occurs at a depth of about 0.1 μm or over from the surface of the semiconductor substrate. In order to suppress the occurrence of such punch throughs, a technique of providing a so-called punch through stopper (PTS) is known. The PTS structure includes a case wherein an impurity ion of a conduction type opposite to that of source-drain is ion implanted once thereby forming a pocket structure in the vicinity of a source-drain or LDD (lightly doped drain) structure, and another case wherein a similar impurity ion is implanted into the whole area of a channel region, thereby forming a PST structure wholly over the area.

The technique of suppressing the punch through by formation of the PTS structure is described, for example, in Japanese Laid-open Patent Application No. 2000-196079.

SUMMARY OF THE INVENTION

We have found that the above-stated PTS structures have the following problems.

With the whole-area PTS structure, in order to suppress a punch through in case where the gate electrode of MISFET becomes fine, it becomes necessary to increase an impurity concentration in a semiconductor substrate in which MISFET is to be formed. To this end, the threshold voltage of MISFET cannot be lowered, with the attendant problem that the drive ability of MISFET cannot be improved.

On the other hand, with the case of the pocket structure formed by vertically implanting an impurity ion, when a shallow punch through is suppressed by the action of the pocket structure, an impurity concentration at the deep region of the channel becomes higher than as desired. This results in an increasing junction capacitance and junction leakage current, with the problem that the drive ability of MISFET cannot be improved.

With the pocket structure formed by implanting an impurity ion obliquely, when a deep punch through is suppressed by means of the pocket structure, an impurity concentration at the central portion of the channel increases. This increases the threshold voltage of MISFET owing to the reverse short channel effect, resulting in the lowering of the current between the source and drain. This arises the problem that the drive ability of MISFET cannot be improved.

With the structure formed by combination of the pocket structure formed by obliquely implanting an impurity ion and the whole-area PTS structure, the formation of the whole-area PTS structure has to be formed, as set forth hereinabove, so that the impurity concentration in the semiconductor substrate, in which MISFET is to be formed, undesirably becomes high. Accordingly, the body-effect coefficient of the semiconductor substrate increases. This, in turn, results in the increase of space charge to lower a carrier density, so that the current between the source and drain lowers. This presents the problem that the drive ability of MISFET cannot be improved as well.

An object of the invention is to provide a technique of reliably suppress punch through in MISFET.

Another object of the invention is to provide a technique of improving the drive ability of MISFET.

The above and other objects and novel features of the invention will becomes apparent from the description of the specification and the accompanying drawings attached herewith.

Typical embodiments of the invention are briefly described below.

The invention provides a method of manufacturing a semiconductor integrated circuit device, comprising the steps of: forming a gate electrode on a main surface of a semiconductor substrate and introducing an impurity of a second conduction type into the semiconductor substrate in the existence of the gate electrode to form a first semiconductor region of the second conduction type, implanting an impurity of a first conduction type vertically with respect to the main surface of the semiconductor substrate to form a second semiconductor region of the first conduction type at a lower portion of the first semiconductor region, implanting an impurity of the first conduction type obliquely relative to the main surface of the semiconductor substrate to form a third semiconductor region of the first conduction type between the first semiconductor region and the second semiconductor region, and after the formation of the third semiconductor region, introducing an impurity of the second conduction type into the semiconductor substrate to form a fourth semiconductor region of the second conduction type thereby forming MISFET, wherein a dosage of the impurity introduced upon the formation of the third semiconductor region is higher than a dosage of the impurity introduced upon the formation of the second semiconductor region.

The invention also provides a semiconductor integrated circuit device which comprises:

(a) MISFET having source-drain of an LDD structure made of a first semiconductor region of a second conduction type and a fourth semiconductor region of the second conduction type;

(b) a second semiconductor region of a first conduction type formed at a lower portion of the source-drain; and (c) a third semiconductor region of the first conduction type formed at a region between the first semiconductor region and the second semiconductor region wherein a dosage of an impurity ion introduced into the third semiconductor region is relatively higher than a dosage of an impurity ion introduced into the second semiconductor region.

DETAILED DESCRIPTION OF THE PREFERRD EMBODIMENTS

Figure 1:
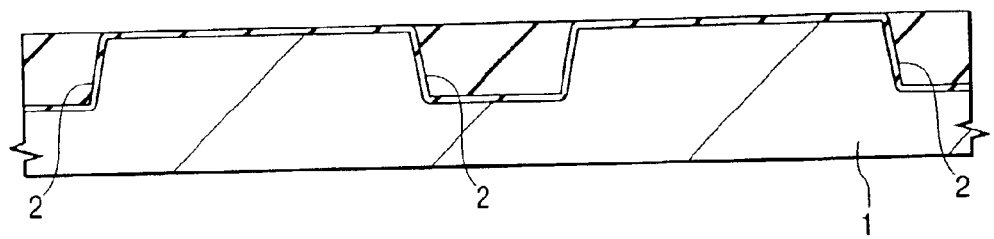
FIG. 1 is a sectional view of an essential part showing a method of manufacturing a semiconductor integrated circuit device according to one embodiment of the invention.

The method of manufacturing a semiconductor integrated circuit device according to an embodiment of the invention is described in detail with reference to the accompanying drawings, in which like reference numerals indicate like members throughout the drawings and may not be repeatedly explained.

The method of manufacturing a semiconductor integrated circuit device according to this embodiment is illustrated with reference to FIGS. 1 to 10.

As shown in FIG. 1, a semiconductor substrate 1 made of single crystal silicon having a specific resistance of approximately 10 Ωcm is thermally treated at approximately 850° C. to form, on a main surface thereof, a thin silicon oxide film (pad oxide film) having a thickness of approximately 10 nm. Next, a silicon nitride film having a thickness of approximately 120 nm is deposited on the silicon oxide film by a CVD (chemical vapor deposition) method, after which the silicon nitride film and the silicon oxide film formed at an element isolation region are, respectively, removed by dry etching through a mask of a photoresist film. The silicon oxide film is formed for the purpose of mitigating the stress exerted on the substrate when a silicon oxide film buried inside an element isolation groove in a subsequent step is densified. On the other hand, the silicon nitride film is unlikely to suffer oxidation in nature and can be utilized as a mask for preventing the surface of the substrate provided therebeneath (active region) from being oxidized.

Subsequently, a groove having a depth of approximately 350 nm is formed at the element isolation region of the semiconductor substrate 1 by dry etching through a mask of the silicon nitride film, after which in order to remove a damage layer on the inner wall of the groove caused by the etching, the semiconductor substrate 1 is thermally treated at approximately 1000° C., thereby forming a thin silicon oxide film having a thickness of approximately 10 nm on the inner wall of the groove.

Next, after deposition of a silicon oxide film on the semiconductor substrate 1 by a CVD method, the quality of this silicon oxide film is improved by thermal treatment of the semiconductor substrate 1 to density the silicon oxide film. Thereafter, the thus densified silicon oxide film is polished according to a chemical mechanical polishing (CMP) method using the silicon nitride film as a stopper and is left inside the groove, thereby forming an element isolation groove 2 whose surface is planarized.

Figure 2:
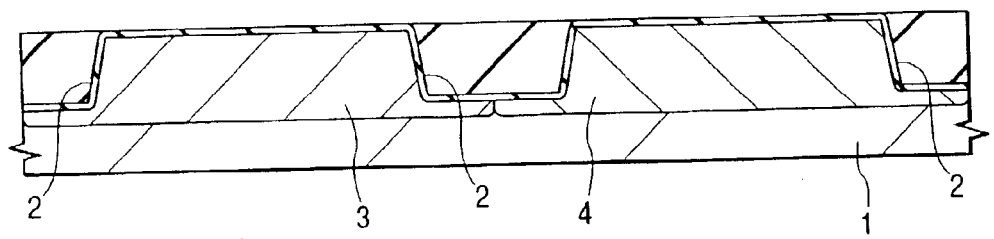
FIG. 2 is a sectional view of the essential part in the course of the manufacture of the semiconductor integrated circuit device subsequent to FIG. 1.

Next, after removal of the silicon nitride film left on the active region of the semiconductor substrate 1 by wet etching using hot phosphoric acid, an impurity ion (e.g. B (boron)) having a p-type conduction type (first conduction type) is ion-implanted into a region where an n-channel-type MISFET of the semiconductor substrate 1 is to be formed, thereby forming a p-type well (first well) 3 as shown in FIG. 2. Thereafter, an impurity ion (e.g. P (phosphorus)) of an n-type conduction type (second conduction type) is ion implanted into a region (second region) where a p-channel-type MISFET of the semiconductor 1 is to be formed, thereby forming an n-type well (second well) 4.

Figure 3:
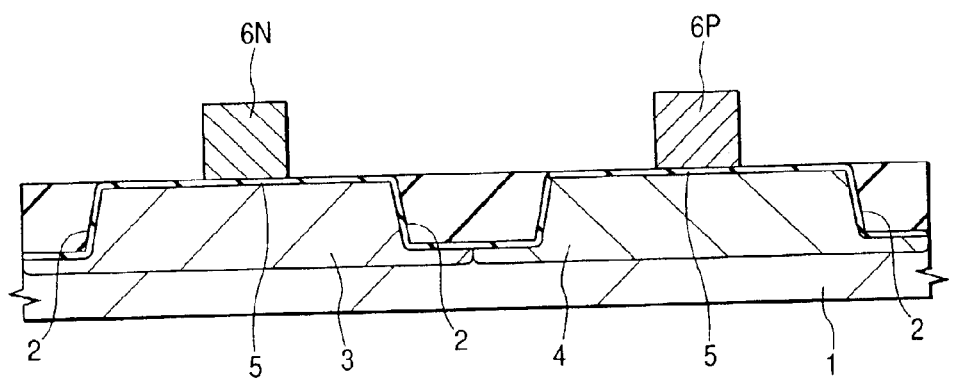
FIG. 3 is a sectional view of the essential part in the course of the manufacture of the semiconductor integrated circuit device subsequent to FIG. 2.

As shown in FIG. 3, the semiconductor substrate 1 is thermally treated to form a clean gate oxide film 5 on the surfaces of the p-type well 3 and the n-type well 4.

Subsequently, a non-doped polysilicon film having a thickness of approximately 90 to 100 nm is deposited on the semiconductor substrate 1 by a CVD method. Thereafter, using a mask for ion implantation, P (phosphorus) is ion-implanted into the non-doped polysilicon film above the p-type well 3, thereby forming an n-type polysilicon film. Further, using a mask for ion implantation, B (boron) is ion-implanted into the non-doped polysilicon film of the n-type well to form a p-type polysilicon film.

Next, the n-type polysilicon film and p-type polysilicon film are, respectively, dry etched using a mask of a photoresist film patterned according to a lithographic technique. In this way, a gate electrode 6N made of the n-type polysilicon film is formed above the gate oxide film on the p-type well 3, and a gate electrode 6P made of the p-type polysilicon film is formed above the gate oxide film 5 on the n-type well 4. It is illustrated in this embodiment that the gate electrode 6N and the gage electrode 6P are, respectively, those having a gate length of 0.12 μm.

Figure 4:
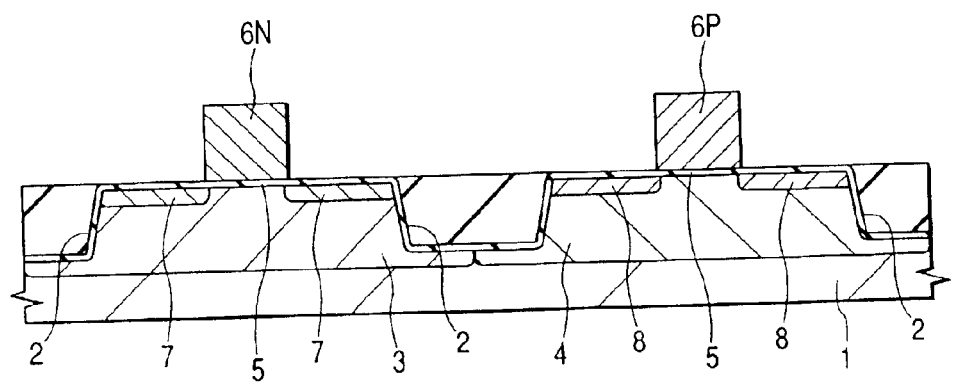
FIG. 4 is a sectional view of the essential part in the course of the manufacture of the semiconductor integrated circuit device subsequent to FIG. 3.

After the removal of the photoresist film, as shown in FIG. 4, an n-type impurity of approximately $2\times10^{15}$ ions/cm², e.g.

As (arsenic), is ion-implanted into the p-type well 3 by use of energy of about 5 keV, thereby forming an n-type diffusion region (first semiconductor region) 7 at opposite sides of the gate electrode 6N. Subsequently, a p-type impurity of approximately $1\times10^{15}$ ions/cm$^2$, e.g. BF$_2$ (boron difluoride), is ion-implanted by use of energy of about 3 keV, thereby forming a p-type diffusion region (fifth semiconductor region) 8 at opposite sides of the gate electrode 6P.

Figure 5:
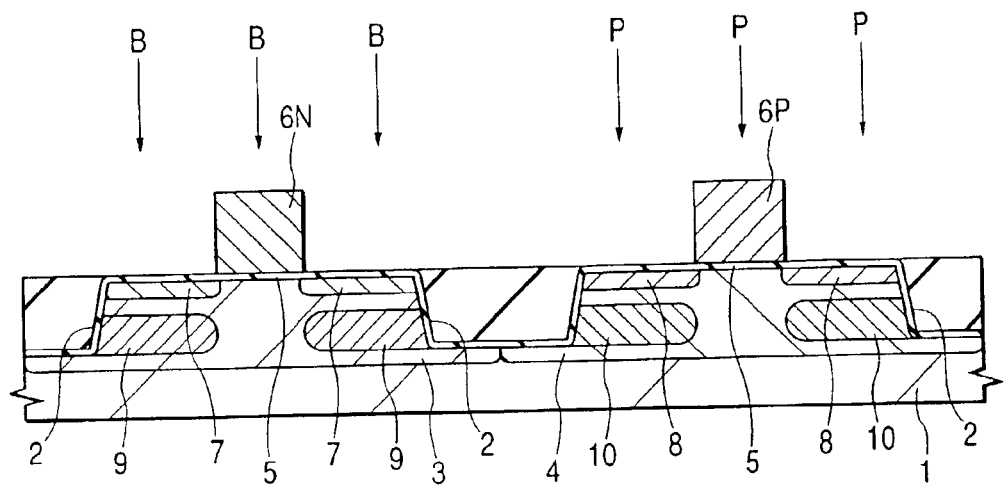
FIG. 5 is a sectional view of the essential part in the course of the manufacture of the semiconductor integrated circuit device subsequent to FIG. 4.

Next, as shown in FIG. 5, an impurity ion (light ion (e.g. B)), which has a polarity opposite to that of the impurity ion forming the n-type diffusion region 7, is implanted into a lower portion of the n-type diffusion region 7, thereby forming a first p-type pocket (second semiconductor region) 9 (which may be sometimes referred to as deep pocket layer only for illustration). For this purpose, the impurity ion is implanted, for example, at energy of approximately $6\times10^{12}$ ions/cm$^2$. The angle of incidence upon the implantation of the impurity ion is so arranged as to be vertical relative to the main surface (element-forming surface) of the semiconductor substrate 1. This permits the impurity concentration in the first p-type pocket layer to be maximized at a portion between the bottom of the n-type diffusion region 7 and the bottom of source-drain regions of an n-channel-type MISFET to be formed in a subsequent step. As a result, in the n-channel-type MISFET to be formed in a subsequent step, the punch through between the source-drain regions (deep punch through) can be suppressed.

Like the case where the first p-type pocket layer is formed, an impurity ion (light ion (e.g. P)) having a polarity opposite to that of the impurity ion forming the p-type diffusion region 8 is implanted into a lower portion of the p-type diffusion region 8, thereby forming a first n-type pocket layer (sixth semiconductor region) 10 (which may be sometimes referred to as a deep pocket layer for convenience's sake). For this purpose, the impurity ion is implanted, for example, at approximately $4\times10^{12}$ ions/cm$^2$ by energy of about 55 keV. The angle of incidence upon the implantation of the impurity ion is so arranged as to be vertical relative to the main surface of the semiconductor substrate 1, like the case where the first p-type pocket layer 9 is formed. This permits the concentration of the impurity in the first n-type pocket layer 10 to be maximized at a portion between the bottom of the p-type diffusion region 8 and the bottom of source-drain regions of a p-channel-type MISFET to be formed in a subsequent step. As a result, in the p-channel-type MISFET to be formed in a subsequent step, the punch through between the source-drain regions (deep punch through) can be suppressed.

Figure 6:
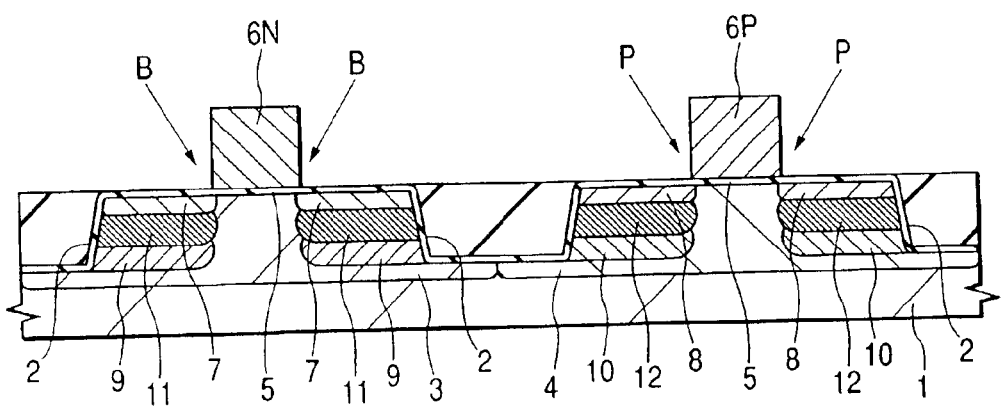
FIG. 6 is a sectional view of the essential part in the course of the manufacture of the semiconductor integrated circuit device subsequent to FIG. 5.

Next, as shown in FIG. 6, an impurity ion (e.g. boron) of a p-type conduction type is implanted into a region between the n-type diffusion region 7 and the first p-type pocket layer 9, thereby forming a second p-type pocket layer (third semiconductor region) 11 (which may be sometimes referred to as shallow pocket layer for convenience's sake). For the formation, the impurity ion is implanted, for example, at $1\times10^{13}$ ions/cm$^2$ by use of energy of about 10 keV. The angle of incidence upon the implantation of the impurity ion is so arranged as to be inclined (e.g. at approximately 25°) relative to the main surface of the semiconductor substrate 1 wherein the implantation is performed from a plurality of directions. This permits the concentration of the impurity in the second p-type pocket layer to be maximized at a depth substantially equal to the bottom line of the n-type diffusion region 7. As a result, in the n-channel MISFET to be formed in a subsequent step, the punch through between the n-type diffusion regions 7 (shallow punch through) can be suppressed, so that the n-channel type MISFET can be prevented from lowering of threshold voltage.

As stated hereinabove, although B has been illustrated as the impurity ion introduced upon the formation of the second p-type pocket layer in this embodiment, a heavy ion (e.g. In (indium)) that is unlikely to be thermally diffused may be used instead. The use of such a heavy ion enables the punch through between the opposing n-type diffusion regions 7 to be suppressed. More particularly, the inconvenience of lowering the threshold voltage of the n-channel type MISFET can be prevented.

On the other hand, like the case where the second p-type pocket layer 9 is formed, an impurity ion (e.g. P) of an n-type conduction type is implanted into a region between the p-type diffusion region 8 and the first n-type pocket layer 10, thereby forming a second n-type pocket layer (seventh semiconductor region) 12 (which may be sometimes referred to as a shallow pocket layer for convenience's sake). For the formation, the impurity ion is implanted, for example, at approximately $1\times10^{13}$ ions/cm$^2$ by use of energy of about 30 keV. The angle of incidence upon the implantation of the impurity ion is so arranged as to be inclined relative to the main surface of the semiconductor substrate 1 (for example, at approximately 25°), and the implantation is performed from a plurality of directions. This permits the concentration of the impurity in the second n-type pocket layer 12 to be maximized at a depth substantially equal to the bottom line of the p-type diffusion region 8. As a result, in the p-channel type MISFET to be formed in a subsequent step, the punch through between the opposing p-type diffusion regions can be suppressed. Since the punch through between the p-type diffusion regions can be suppressed, it can be conveniently prevented that the threshold voltage of the p-channel type MISFET lowers.

In this embodiment, although P has been illustrated as the impurity ion introduced upon the formation of the second n-type pocket layer 12, a heavy ion (e.g. Sb (antimony)) that is unlikely to cause thermal diffusion (or has a small coefficient of diffusion) may be used instead. The use of such a heavy ion enables one to suppress the punch through between the opposing p-type diffusion regions 8. That is, the inconvenience of lowering the threshold voltage of the p-channel type MISFET can be prevented.

Figure 7:
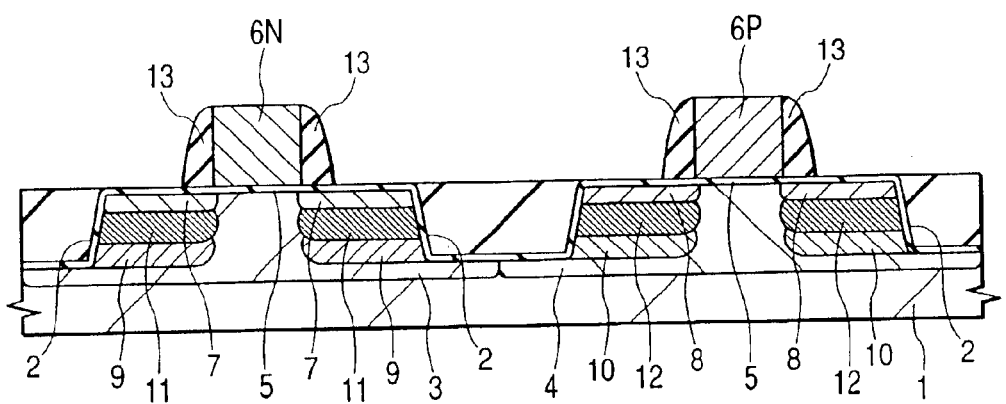
FIG. 7 is a sectional view of an essential part in the course of the manufacture of the semiconductor integrated circuit device subsequent to FIG. 6.

Next, as shown in FIG. 7, a silicon oxide film having a thickness of approximately 100 nm is deposited on the semiconductor substrate 1 by a CVD method, and the silicon oxide film is anisotropically etched by use of a reactive etching (RIE) method. As a result, a side wall spacer (first insulating film) 13 is formed on side walls of the gate electrode 6N and the gate electrode 6P, respectively.

Figure 8:
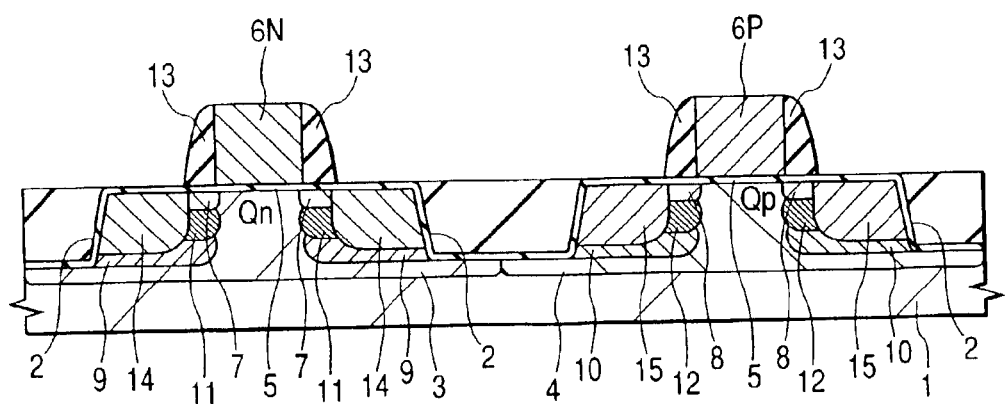
FIG. 8 is a sectional view of the essential part in the course of the manufacture of the semiconductor integrated circuit device subsequent to FIG. 7.

Thereafter, as shown in FIG. 8, an n-type impurity, e.g. As, is ion-implanted into the p-type well 3 at approximately $4\times10^{15}$ ions/cm$^2$ by use of energy of about 40 keV to form an n-type source-drain region (fourth semiconductor region) 14. Subsequently, a p-type impurity, e.g. BF$_2$, is ion-implanted into the n-type well 4 at approximately $2\times10^{15}$ ions/cm$^2$ by use of energy of about 30 keV to form a p-type source-drain region (eighth semiconductor region) 15. According to the steps having set forth hereinabove, an n-channel type MISFET (first MISFET) Qn (hereinafter referred to simply as nMISQn) and a p-channel type MISFET (second MISFET) Qp (hereinafter referred to simply as pMISQp) can be formed, respectively. At this stage, the first p-type pocket layer 9 and the first n-type pocket layer 10 have such forms as to cover the lower portions of the n-type source-drain region and the p-type source-drain region, respectively, so that the concentration of the impurity at the depth of the channel in each of the nMISQn and pMISQp can be prevented from being higher than as necessary. More particularly, the junction capacitance at the pn junctions in the nMISQn and pMISQp can be reduced. In this way, the drive ability of the nMISQn and pMISQp according to this embodiment can be improved.

Figure 9:
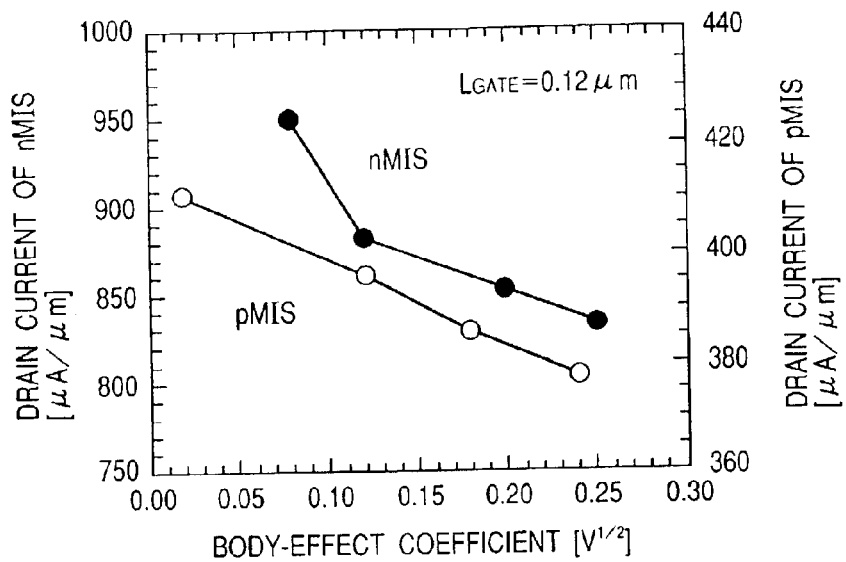
FIG. 9 is a graph showing the relation between the body-effect coefficient of a semiconductor device and the drain current of MISFET.

According to an experiment conducted by us, it has been found that as shown in FIG. 9, as the body-effect coefficient of a semiconductor substrate increases, the currents of nMIS and pMIS decrease. For instance, where the punch through between the source and drain of each of nMIS and pMIS is suppressed, the impurity concentration of the semiconductor substrate increases. This results in an increase of the body-effect coefficient of the semiconductor substrate, thereby decreasing the drain currents of nMIS and pMIS. In contrast thereto, according to this embodiment, a PTS structure over the whole area is not formed, but with nMISQn, a pocket structure made of the first p-type pocket layer 9 and the second p-type pocket layer 11 is formed, and with pMISQp, a pocket structure made of the first n-type pocket layer 10 and the second n-type pocket layer 12 is formed. Accordingly, not only the punch through can be suppressed, but also the impurity concentration in the semiconductor substrate is prevented from becoming higher than as required, so that the reduction in drain current of nMISQn and pMISQp can be prevented. In other words, the drive ability of nMISQn and pMISQp of this embodiment can be improved.

Figure 10:
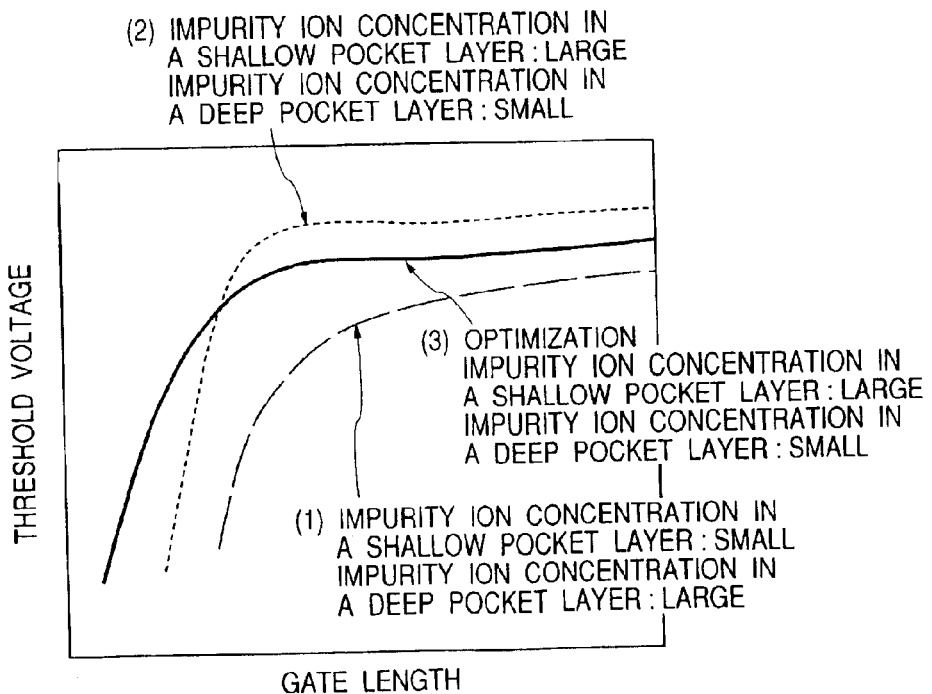
FIG. 10 is a graph showing the relation between the impurity ion concentrations in a shallow pocket layer and a deep pocket layer and the threshold voltage characteristic in MISFET of the semiconductor integrated circuit device according to the one embodiment of the invention.

Further, according to an experiment conducted by us, it has been found that as shown in FIG. 10, when the impurity ion concentration in the deep pocket layer is larger than that of the shallow pocket layer in nMISQn and pMISQp, the punch through between the n-type diffusion regions 7 and the punch through between the p-type diffusion regions cannot be suppressed, and with a short gate length, the threshold voltages of nMISQn and pMISQp, respectively, lower owing to the short channeling effect. On the contrary, it has been also found when the impurity ion concentration of the shallow pocket layer is made larger than that of the deep pocket layer, the short channeling effect can be effectively prevented, thereby preventing the lowering in threshold voltage of nMISQn and pMISQp. In view of this, according to this embodiment, the dosage of ions being injected upon the formation of the shallow pocket layer is made larger than that the dosage of ions being injected upon the formation of the deep pocket layer. In this condition, when the dosages of the respective types of ions are optimized, one is enabled to obtain desired threshold voltage characteristics. Moreover, when the dosage of implanted ions upon the formation of the shallow pocket layer is made larger than that used upon the formation of the deep pocket layer, the increase in junction capacitance and junction leakage current of MISFET at the pn junction thereof can be suppressed. As a result, the drive ability of nMISQn and pMISQp of the embodiment ca be improved.

In this embodiment, an instance, for example, of nMISQn is shown wherein the dosage of ions being injected upon the formation of the n-type diffusion region 7 is smaller than the dosage of ions injected upon the formation of the n-type source-drain region 14. The dosages may be substantially at the same level, or the former dosage may be larger on the contrary. The dosage of injected ions is, for example, at approximately $6 \times 10^{20}$ ions/cm$^2$ for the formation of the n-type diffusion region 7 and at approximately $1 \times 10^{20}$ ions/cm$^2$ form the formation of the n-type source-drain region 14. This permits the sheet resistance of the n-type diffusion region 7 of nMISQn to be reduced, thereby resulting in the increase of a drain current. More particularly, the drive ability of nMISQn can be improved. For similar reasons, the ion dosage at the time of the formation of the p-type diffusion region 8 may be substantially the same as the ion dosage used upon the formation of the p-type source-drain region 15, or may be increased thereover on the contrary. It will be noted that the drive voltages nMISQn and pMISQp are, respectively, at approximately 1.5V, for example.

Figure 11:
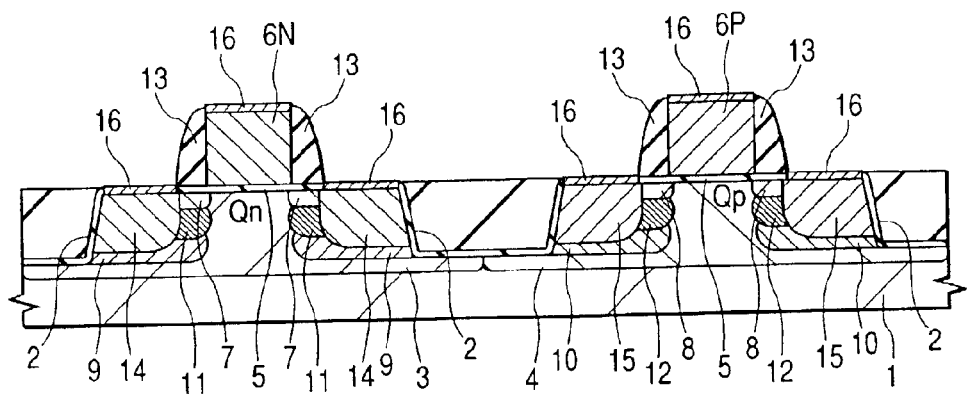
FIG. 11 is a sectional view showing the essential part in the course of the manufacture of the semiconductor integrated circuit device subsequent to FIG. 8.

Next, as shown in FIG. 11, after washing the surface of the semiconductor substrate 1, a Co (cobalt) film (metal film (not shown)) is deposited on the semiconductor substrate 1, for example, by a sputtering method. Subsequently, the semiconductor substrate 1 is thermally treated at about 600° C., thereby causing silicidation reaction to occur at the interfaces between the n-type source-drain region 14, p-type source-drain region 15 and the gate electrodes 6N, 6P and the Co film to from a CoSi$_2$ layer (first conductive film) 16. The formation of the CoSi$_2$ layer 16 can reliably prevent the occurrence of alloy spiking between wirings formed on the n-type source-drain region 14 and p-type source-drain region 15 in a subsequent step and the semiconductor substrate 1.

Next, an unreacted Co film is removed by etching, followed by thermal treatment at about 700 to 800° C. to make the CoSi$_2$ layer low in resistance. This permits the contact resistance between the wirings and each of the n-type source-drain region 14 and the p-type source-drain region 15 to be reduced.

Figure 12:
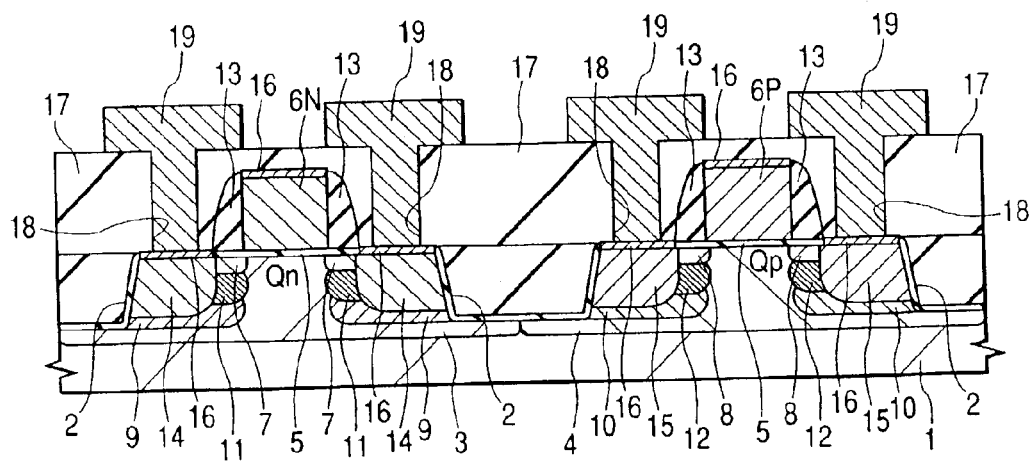
FIG. 12 is a sectional view showing the essential part in the course of the manufacture of the semiconductor integrated circuit device subsequent to FIG. 11.

Next, as shown in FIG. 12, am interlayer insulating film 17 is formed over the nMISQn and pMISQn, followed by dry etching the interlayer insulating film 17 through a mask of a photoresist film to form a through-hole 18 over the n-type source-drain region 14 and the p-type source-drain region 15. Thereafter, a wiring 19 is formed over the interlayer insulating film 17, thereby forming a semiconductor integrated circuit device of this embodiment. The interlayer insulating film 17 is formed by deposition, for example, of a silicon oxide film by a CVD method. The wiring 19 is formed by depositing a metal film, such as W or an Al alloy, over the interlayer insulating film 17, followed by patterning of the metal film by dry etching though a mask of a photoresist mask. It will be noted that the steps of forming the interlayer insulating film 17, through-hole 18 and wiring 19 may be repeated plural times to form a multi-layered wiring structure.

The invention has been particularly described hereinabove based on the embodiment of the invention, which should not be construed as limiting the invention thereto. Various changes and modifications may be possible without departing from the spirit of the invention.

For instance, in the above embodiment, such an instance is described where the silicidation reaction is caused by deposition of the Co film, followed by thermal treatment. A Ti (titanium) film may be used instead of the Co film.

Moreover, the method of making a semiconductor integrated circuit device of the invention is especially effective for application to the manufacture, for example, of LSI's requiring high-speed operations, such as logic LSI and SRAM, and also of LSI's requiring low consumption power.

The effects attained by typical embodiments of the invention are briefly summarized below.

(1) In MISFET, when a shallow pocket layer (third semiconductor region) and a deep pocket layer (second semiconductor region) are formed, the punch through between the diffusion regions of the MISFET can be suppressed by the action of the shallow pocket layer, and the punch through between the source and drain regions can be suppressed by the action of the deep pocket layer, so that the punch throughs in MISFET can be reliably suppressed.

(2) In MISFET, when a shallow pocket layer (third semiconductor region) and a deep pocket layer (second semiconductor region) are formed wherein the impurity ion concentration in the shallow pocket layer is made larger than that of the deep pocket layer, a short channel can be effectively prevented, thereby obtaining a desired threshold voltage characteristic.

What is claimed is:

1. A semiconductor integrated circuit device, comprising:
a MISFET having a gate electrode, a source and a drain formed over a main surface of a semiconductor substrate,
wherein said source and drain are formed in a well region of a first conduction type and are of a second conduction type opposite to said first conduction type,
wherein said source and said drain each include:
   a respective first semiconductor region of the second conduction type, and
   a respective fourth semiconductor region of the second conduction type beside said first semiconductor region and further from said gate electrode than said first semiconductor region, said fourth semiconductor region having a greater depth than said first semiconductor region relative to an upper surface of the well region,
wherein a respective second semiconductor region, of the first conduction type, is arranged at a lower portion of each of said source and said drain,
wherein a respective third semiconductor region, of the first conduction type, is formed between aligned portions of said first semiconductor region and said second semiconductor region, and
wherein a dosage of an impurity introduced into said third semiconductor region is relatively larger than a dosage of an impurity introduced into said second semiconductor region.

2. A semiconductor integrated circuit device according to claim 1, wherein a dosage of the impurity introduced into said first semiconductor region is not smaller than a dosage of the impurity introduced into said fourth semiconductor region.

3. A semiconductor integrated circuit device according to claim 1, wherein a dosage of the impurity introduced into said first semiconductor region is at $1 \times 10^{15}$ ions/cm$^2$ or over.

4. A semiconductor integrated circuit device according to claim 1, wherein a dosage of the impurity introduced into said fourth semiconductor region is at $2 \times 10^{15}$ ions/cm$^2$ or over.

5. A semiconductor integrated circuit device according to claim 1, further comprising, on surfaces of said source and said drain, a first conductive film formed by reaction between a metal film and said semiconductor substrate.

6. A semiconductor integrated circuit device according to claim 5, wherein said first conductive film is made of a cobalt silicide film or titanium silicide film.

7. A semiconductor integrated circuit device, comprising:
a MISFET having a gate electrode, a source and a drain formed over a main surface of a semiconductor substrate,
wherein said source and drain are formed in a well region of a first conductive type and are of a second conduction type opposite to said first conduction type,
wherein said source and said drain each include:
   a respective first semiconductor region of the second conduction type, and
   a respective fourth semiconductor region of the second conduction type beside said first semiconductor region and further than said first semiconductor region from said gate electrode, said fourth semiconductor region having a greater depth than said first semiconductor region relative to an upper surface of the well region,
wherein a respective second semiconductor region of the first conduction type, is arranged at a lower portion of each of said source and said drain,
wherein a respective third semiconductor region of the first conduction type is formed between aligned portions of said first semiconductor region and said second semiconductor region, and
wherein said third semiconductor region is formed by introducing an impurity whose diffusion coefficient is relatively smaller than that of an impurity introduced into said second semiconductor region.

8. A semiconductor integrated circuit device according to claim 7, wherein the impurity introduced into said second semiconductor region is made of boron or phosphorus, and the impurity introduced into said third semiconductor region is made of indium or antimony.

9. A semiconductor integrated circuit device according to claim 7, wherein a dosage of the impurity introduced into said third semiconductor region is relatively larger than a dosage of the impurity introduced into said second semiconductor region.

10. A semiconductor integrated circuit device, comprising:
an impurity region of a first conduction type in a semiconductor substrate;
a gate electrode, a source and a drain formed over said semiconductor substrate;
a respective first semiconductor region of a second conduction type, which is opposite to said first conduction type, in said impurity region for each of said source and said drain;
a respective fourth semiconductor region of said second conduction type beside said first semiconductor region and disposed further than said first semiconductor region from said gate electrode for each of said source and said drain, said fourth semiconductor region having a greater depth than said first semiconductor region relative to an upper surface of the impurity region;
a respective second semiconductor region of said first conduction type arranged at a lower portion of each of said source and said drain in said impurity region; and
a respective third semiconductor region of said first conduction type arranged between aligned portions of said first semiconductor region and said second semiconductor region and adjacent to said fourth semiconductor region in said impurity region,
wherein a dosage of an impurity introduced into said third semiconductor region is relatively larger than a dosage of an impurity introduced into said second semiconductor region.

11. A semiconductor integrated circuit device according to claim 10, wherein a dosage of the impurity introduced into said first semiconductor region is not smaller than a dosage of the impurity introduced into said fourth semiconductor region.

12. A semiconductor integrated circuit device according to claim 10, wherein a dosage of the impurity introduced into said first semiconductor region is at $1 \times 10^{15}$ ions/cm$^2$ or over.

13. A semiconductor integrated circuit device according to claim 10, wherein a dosage of the impurity introduced into said fourth semiconductor region is at $2 \times 10^{15}$ ions/cm$^2$ or over.

14. A semiconductor integrated circuit device according to claim 10, further comprising, on surfaces of said source and said drain, a first conductive film formed by reaction between a metal film and said semiconductor substrate.

15. A semiconductor integrated circuit device according to claim 14, wherein said first conductive film is made of a cobalt silicide film or titanium silicide film.

16. A semiconductor integrated circuit device according to claim 10, wherein said third semiconductor region is formed by introducing an impurity whose diffusion coefficient is relatively smaller than that of an impurity introduced into said second semiconductor region.

17. A semiconductor integrated circuit device according to claim 16, wherein the impurity introduced into said second semiconductor region is made of boron or phosphorus, and the impurity introduced into said third semiconductor region is made of indium or antimony.

18. A semiconductor integrated circuit device, comprising:
- an impurity region of a first conduction type in a semiconductor substrate;
- a gate electrode, a source and a drain formed over said semiconductor substrate;
- a respective first semiconductor region of a second conduction type, which is opposite to said first conduction type, in said impurity region for each of said source and said drain;
- a respective fourth semiconductor region of said second conduction type beside said first semiconductor region and disposed further than said first semiconductor region from said gate electrode for each of said source and said drain, said fourth semiconductor region having a greater depth than said first semiconductor region relative to an upper surface of the impurity region;
- a respective second semiconductor region of said first conduction type arranged at a lower portion of each of said source and said drain in said impurity region; and
- a respective third semiconductor region of said first conduction type arranged between aligned portions of said first semiconductor region and said second semiconductor region and adjacent to said fourth semiconductor region in said impurity region,
- wherein an impurity ion concentration of said third semiconductor region is relatively larger than that of said second semiconductor region.

19. A semiconductor integrated circuit device according to claim 18, wherein an impurity ion concentration of said first semiconductor region is not smaller than that of said fourth semiconductor region.

20. A semiconductor integrated circuit device according to claim 18, further comprising, on surfaces of said source and said drain, a first conductive film formed by reaction between a metal film and said semiconductor substrate.

21. A semiconductor integrated circuit device according to claim 20, wherein said first conductive film is made of a cobalt silicide film or titanium silicide film.

22. A semiconductor integrated circuit device according to claim 18, wherein said third semiconductor region is formed by introducing an impurity whose diffusion coefficient is relatively smaller than that of an impurity introduced into said second semiconductor region.

23. A semiconductor integrated circuit device according to claim 22, wherein the impurity introduced into said second semiconductor region is made of boron or phosphorus, and the impurity introduced into said third semiconductor region is made of indium or antimony.

24. A semiconductor integrated circuit device, comprising:
- an impurity region of a first conduction type in a semiconductor substrate;
- a gate electrode, a source and a drain formed over said semiconductor substrate;
- a respective first semiconductor region of a second conduction type, which is opposite to said first conduction type, in said impurity region for each of said source and said drain;
- a respective fourth semiconductor region of said second conduction type beside said first semiconductor region and disposed further than said first semiconductor region from said gate electrode for each of said source and said drain, said fourth semiconductor region having a greater depth than said first semiconductor region relative to an upper surface of the impurity region; and
- a respective second semiconductor region of said first conduction type arranged at a lower portion of each of said source and said drain in said impurity region; and
- a respective third semiconductor region of said first conduction type arranged between aligned portions of said first semiconductor region and said second semiconductor region and adjacent to said fourth semiconductor region in said impurity region,
- wherein said third semiconductor region is formed by introducing an impurity whose diffusion coefficient is relatively smaller than that of an impurity introduced into said second semiconductor region.

25. A semiconductor integrated circuit device according to claim 24, wherein the impurity introduced into said second semiconductor region is made of boron or phosphorus, and the impurity introduced into said third semiconductor region is made of indium or antimony.

26. A semiconductor integrated circuit device, comprising:
- an FET structure including a gate electrode, a source and a drain formed over a main surface of a semiconductor substrate,
- wherein said source and said drain are formed in a well region of a first conduction type and are of a second conduction type opposite to said first conduction type,
- wherein a first part of said source and a first part of said drain are opposed to each other,
- wherein a respective first pocket region of said first conduction type and effective as a first punch through stopper portion is arranged at a lower portion of each of said source and said drain, and
- wherein a respective second pocket region of said first conduction type and effective as a second punch through stopper portion is arranged between said first part of each of said source and said drain and a portion of the corresponding first pocket region aligned with said first part.

27. A semiconductor integrated circuit device according to claim 26, wherein said second pocket region is formed by introducing an impurity whose diffusion coefficient is relatively smaller than that of an impurity introduced into said first pocket region.

28. A semiconductor integrated circuit device according to claim 26, wherein an impurity ion concentration of said second pocket region is relatively larger than that of said first pocket region.

29. A semiconductor integrated circuit device according to claim 28, wherein a dosage of the impurity introduced into said second pocket region is at $1 \times 10^{13}$ ions/cm2 or over.

30. A semiconductor integrated circuit device according to claim 28, wherein a dosage of the impurity introduced into said first pocket region is at $4 \times 10^{12}$ ions/cm2 or over.

* * * * *